(12) United States Patent
Inoue et al.

(10) Patent No.: US 6,721,346 B2
(45) Date of Patent: Apr. 13, 2004

(54) SOLID STATE LASER APPARATUS

(75) Inventors: Yoko Inoue, Tokyo (JP); Shuichi Fujikawa, Tokyo (JP); Keisuke Furuta, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 176 days.

(21) Appl. No.: 09/883,956

(22) Filed: Jun. 20, 2001

(65) Prior Publication Data

US 2002/0009110 A1 Jan. 24, 2002

(30) Foreign Application Priority Data

Jul. 13, 2000  (JP) ........................................ 2000-212619

(51) Int. Cl.[7] ............................ H01S 3/091; H01S 3/10
(52) U.S. Cl. ........................................... 372/75; 372/25
(58) Field of Search .............................. 372/25, 70, 72, 372/75, 22, 41, 69

(56) References Cited

U.S. PATENT DOCUMENTS

| | | | |
|---|---|---|---|
| 4,439,861 A | | 3/1984 | Bradford |
| 4,794,615 A | * | 12/1988 | Berger et al. .................. 372/75 |
| 5,173,910 A | * | 12/1992 | Pochelle ...................... 372/22 |
| 5,978,407 A | * | 11/1999 | Chang et al. .................. 372/72 |
| 5,982,789 A | | 11/1999 | Marshall et al. |

* cited by examiner

*Primary Examiner*—Quyen Leung
(74) *Attorney, Agent, or Firm*—Leydig, Voit & Mayer, Ltd.

(57) ABSTRACT

A solid state laser excited by a semiconductor laser can generate a stable and highly efficient high power laser beam. The laser apparatus includes a solid state laser element containing an active medium, a semiconductor laser for optically exciting the solid state laser element, a power supply for supplying pulses of current having magnitudes that change with time during each pulse to the semiconductor laser, and an optical resonator for emission of a laser beam from the solid state laser element. When the semiconductor laser is driven with the pulses that change in magnitude during each pulse, it produces pulsed excitation light that excites the solid state laser element. A stable laser beam is produced because changes in thermally sensitive light-generating parameters of the semiconductor laser are compensated.

12 Claims, 16 Drawing Sheets

SOLID STATE LASER APPARATUS

This application is based on Application No. 2000-212619, filed in Japan on Jul. 13, 2000, the contents of which are hereby incorporated by reference.

BACKGROUND OF THE INVENTION

1. Field of the Invention

The present invention relates to a semiconductor laser excitation solid state laser apparatus capable of generating a laser beam stably and efficiently.

2. Description of the Related Art

FIGS. 17(a) and 17(b) are a side view and a cross sectional view, respectively, illustrating the construction of a conventional semiconductor laser excitation solid state laser apparatus disclosed for example in a document entitled "Advanced High-Power Lasers", SPIE Vol. 3889, pp. 182–189. FIG. 18 is a view illustrating the waveform of input current supplied to a semiconductor laser and the waveform of laser output power generated thereby.

In FIGS. 17(a) and 17(b), the conventional semiconductor laser excitation solid state laser apparatus includes an excitation light source in the form of a semiconductor laser 1 for irradiating semiconductor laser beam which is excitation light, a solid state laser element in the form of a slab-type Nd:YAG laser 2, and a flow tube 4.

The solid state laser element 2 is inserted into the flow tube 4. In order to cool the solid state laser element 2, a cooling medium 5 in the form of cooling water is caused to flow between the solid state laser element 2 and the flow tube 4. The semiconductor laser 1 is installed outside the flow tube 4, and irradiates a semiconductor laser beam 3 which is reflected and guided by a gold mirror 6 to pass through the flow tube 4 to excite the solid state laser element 2. In addition, the surroundings of the flow tube 4 are covered with the gold mirror 6 excepting an area thereof entered by the semiconductor laser beam 3. With this arrangement, there is obtained the effect of confining the semiconductor laser beam 3 inside the flow tube 4, thus improving the excitation efficiency. Also, provisions are made for a main reflection mirror and a partial reflection mirror which together constitute a resonator. A laser beam 11 is radiated from the resonator to the outside thereof.

Now, reference will be made to the operation of the solid state laser apparatus by means of the pulsed excitation of the semiconductor laser 1.

The semiconductor laser 1, when supplied with current, emits a semiconductor laser beam from its light emitting portion. In the past, when the semiconductor laser is caused to perform a pulsed operation, the current value within one pulse was maintained constant as shown by the input current waveform in FIG. 18. Inside the semiconductor laser, a difference between the output energy taken out therefrom as the semiconductor laser beam and the input energy due to the current supplied thereto results in the heat generated by the semiconductor laser. Though not shown herein, this heat is removed by means of an unillustrated cooling device.

The solid state laser element 2 is excited by the semiconductor laser beam irradiated from the semiconductor laser 1 to generate spontaneous emission light.

In this case, by the provision of the optical resonator composed of the mirrors 9 and 10, as illustrated in FIG. 17(a), the spontaneous emission light is amplified while repeatedly reciprocating between the mirrors 9, 10 of the resonator so that it is turned into a laser beam of a good directivity. When the laser beam is amplified to a certain magnitude or above, it is discharged as a laser beam 11 to the outside of the resonator.

Here, note that it takes a certain time from the start of current being supplied to the semiconductor laser 1 until the time a thermal equilibrium is established between the input energy and the output energy taken out as the semiconductor laser beam plus the discharged heat of the cooling device. Therefore, in cases where a constant current is always supplied to the semiconductor laser 1 as in the prior art, the internal temperature of the semiconductor laser 1 changes over time until the thermal equilibrium is reached inside the semiconductor laser 1.

The oscillation spectrum of the semiconductor laser 1 has temperature dependency and changes into a longer wavelength as the temperature rises. In the pulsed operation of the conventional semiconductor laser 1, the oscillation spectrum within one pulse also changes over time in accordance with a temperature change. As a result, the consistency between the oscillation spectrum of the semiconductor laser 1 and the absorption spectrum of the solid state laser element 2 decreases even in the entire duration of one pulse, thus resulting in a decrease in the absorption factor of the semiconductor laser beam, etc.

For example, in case where the oscillation spectrum of the semiconductor laser 1 is longer than the absorption spectrum of the solid state laser element 2 under thermal equilibrium, the absorption factor of the semiconductor laser beam in the solid state laser element 2 becomes high immediately after the start of excitation. However, the absorption factor of the semiconductor laser beam within one pulse decreases successively due to a wavelength change over time resulting from a temperature rise, so that the laser output power in a one pulse duration also decreases successively. Thus, when the semiconductor laser is applied to the usage of processing or the like, there arises a problem of deteriorated processing quality.

Moreover, since the absorption factor of the excitation light immediately after the start of excitation is high, a spike of the laser pulse head due to a relaxed oscillation (i.e., gradual oscillation) becomes remarkable as appearing in FIG. 18. This becomes not only a cause of deteriorating the processing quality but also one of factors damaging optical components such as resonator mirrors, etc.

SUMMARY OF THE INVENTION

The present invention is intended to obviate the problems as referred to above, and has its object to provide a semiconductor laser excitation solid state laser apparatus which is capable of suppressing, in a semiconductor laser under pulsed operation, a change in the oscillation spectrum of the semiconductor laser within one pulse, and exciting a solid state laser medium efficiently to generate a laser beam of high power in a stable manner.

Bearing the above object in mind, according to the present invention, there is provided a semiconductor laser excitation solid state apparatus comprising: a solid state laser element containing an active medium; a semiconductor laser for optically exciting the solid state laser element; a power supply for supplying electric power to the semiconductor laser; and an optical resonator for taking out a laser beam from the optically excited solid state laser element; wherein when the semiconductor laser is pulse-operated to pulse-excite the solid state laser element, current supplied to the solid state laser element is changed within one pulse.

In a preferred form of the present invention, when the semiconductor laser is pulse-operated to pulse-excite the solid state laser element, current supplied to the solid state laser element is decreased successively within one pulse.

In another preferred form of the present invention, when the semiconductor laser is pulse-operated to pulse-excite the solid state laser element, current supplied to the solid state laser element is decreased successively in an initial stage of a pulse within one pulse.

In a further preferred form of the present invention, when the semiconductor laser is pulse-operated to pulse-excite the solid state laser element, current supplied to the solid state laser element is increased successively within one pulse.

In a yet further preferred form of the present invention, when the semiconductor laser is pulse-operated to pulse-excite the solid state laser element, current supplied to the solid state laser element is increased successively in an initial stage of a pulse within one pulse.

In a still further preferred form of the present invention, when the semiconductor laser is pulse-operated to pulse-excite the solid state laser element, current supplied to the solid state laser element is changed stepwise within one pulse.

In a further preferred form of the present invention, the semiconductor laser excitation solid state laser apparatus further comprises: a diffusive reflector arranged to enclose the solid state laser element and having an inner surface constructed to diffuse and reflect laser beam; and an optical waveguide element for guiding the laser beam emitted from the semiconductor laser into the interior of the diffusive reflector while repeating total reflections of the laser beam.

In a further preferred form of the present invention, the solid state laser element has a rectangle cross section and is arranged on a cooling plate.

The above and other objects, features and advantages of the present invention will become more readily apparent to those skilled in the art from the following detailed description of preferred embodiments of the present invention taken in conjunction with the accompanying drawings.

DESCRIPTION OF THE PREFERRED EMBODIMENTS

Now, preferred embodiments of the present invention will be described in detail while referring to the accompanying drawings.

Embodiment 1

Figure 1:
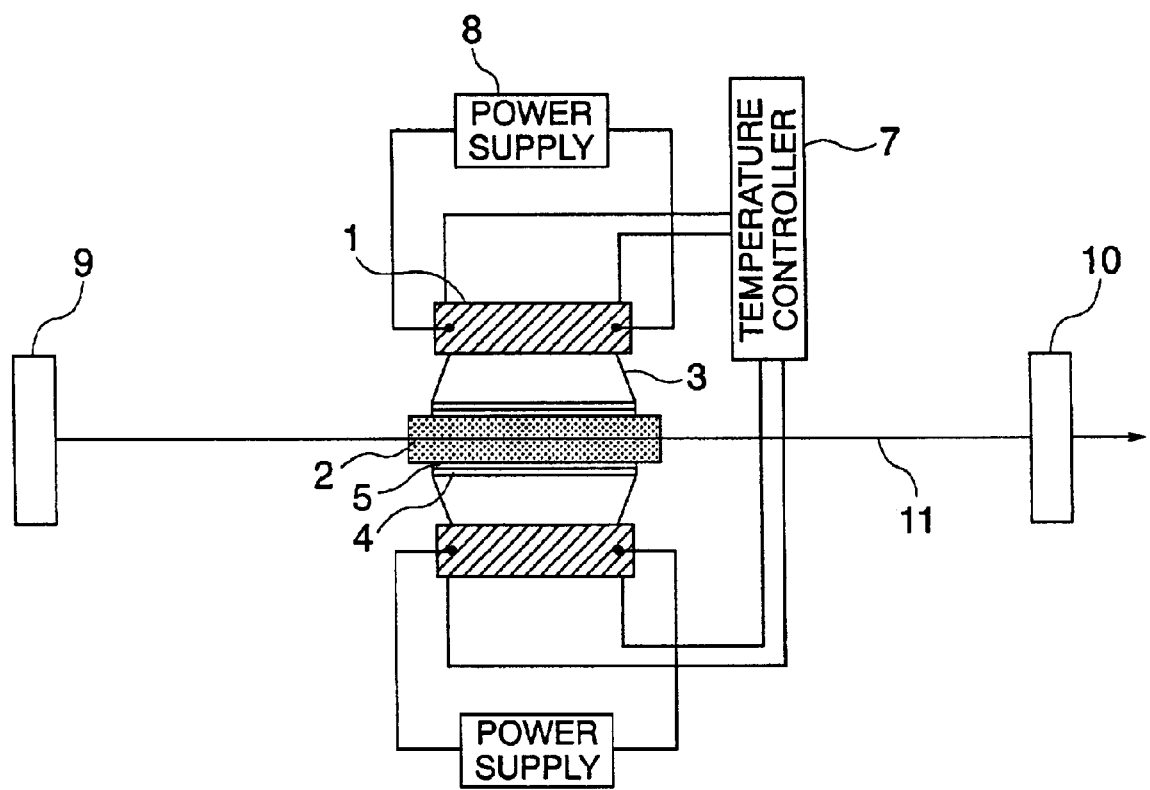
FIG. 1 is a block diagram illustrating a semiconductor laser excitation solid state laser apparatus according to a first embodiment of the present invention.

FIG. 1 illustrates a semiconductor laser excitation solid state laser apparatus according to a first embodiment of the present invention.

Figure 17:
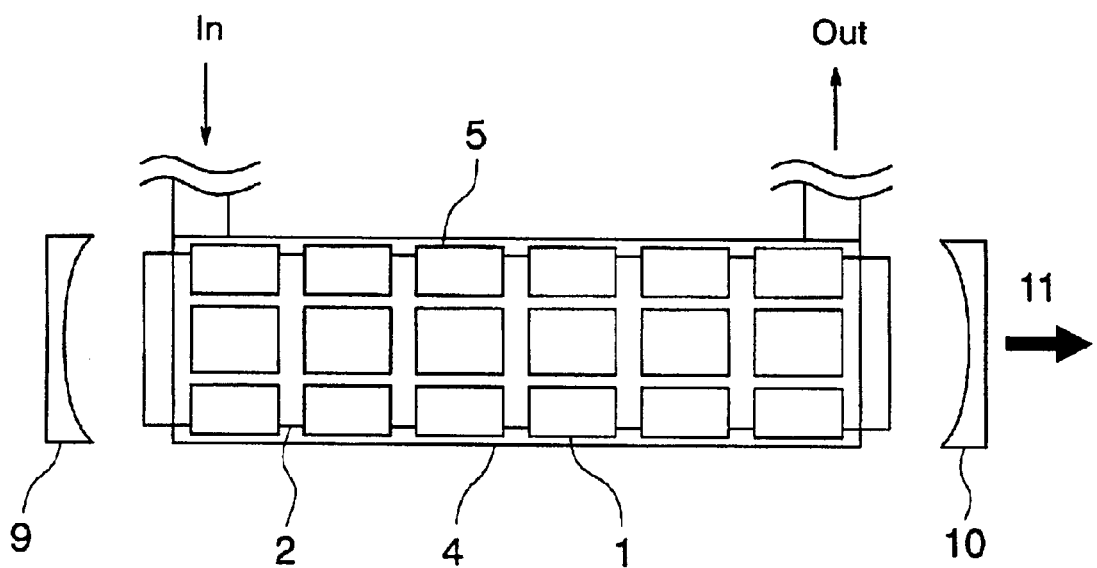
FIG. 17(a) is a side view illustrating a conventional semiconductor laser excitation solid state laser apparatus.
FIG. 17(b) is a cross sectional view of the conventional semiconductor laser excitation solid state laser apparatus.
Figure 17:
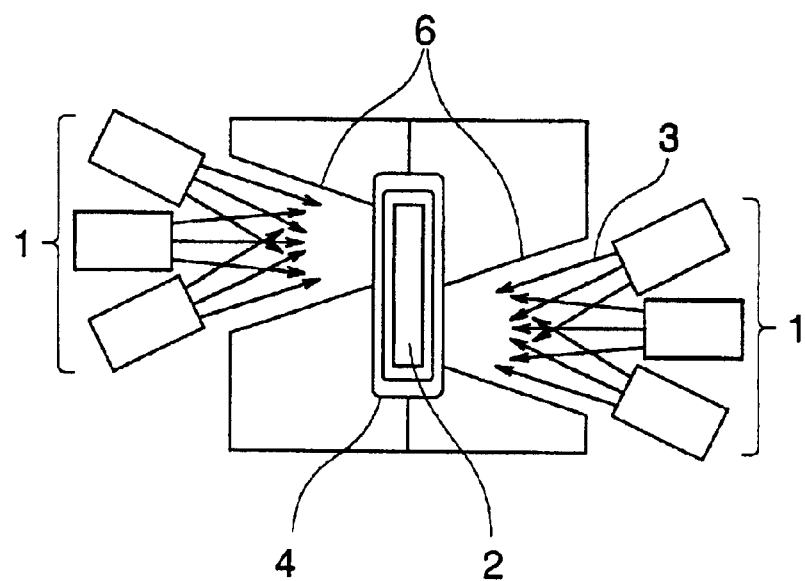
Figure 18:
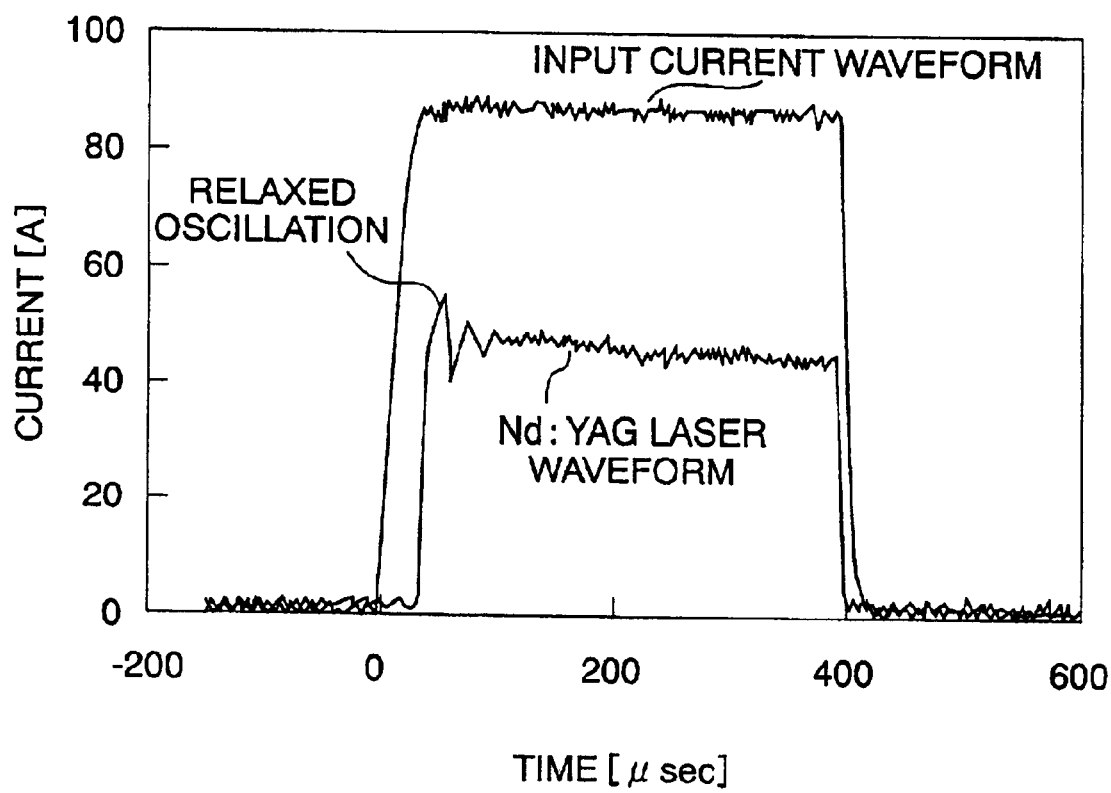
FIG. 18 is a view illustrating the waveform of current to be supplied into a conventional semiconductor laser.

In FIG. 1, the same symbols as those in FIG. 17 designate the same or corresponding parts. In this first embodiment, a solid state laser element 2 containing an active medium comprises an Nd:YAG (Nd: Yttrium Aluminum Garnet), for instance, and takes a rod-like shape having a round cross section. A flow tube 4 is mounted on the solid state laser element 2 in such a manner as to enclose it. A cooling medium 5 is caused to flow between the flow tube 4 and the solid state laser element 2. A semiconductor laser 1 is arranged at a location outside the flow tube 4. The flow tube 4 is formed of a material such as glass, quartz. etc., which permits a semiconductor laser beam 3 emitted from the semiconductor lasers 1 to pass therethrough.

The semiconductor laser 1 is connected with a temperature controller 7. The temperature controller 7 controls the temperature of semiconductor laser 1 in such a manner that the spectrum of the semiconductor laser beam 3 emitted from the semiconductor laser 1 substantially coincides with the absorption spectrum of the solid state laser element 2.

The semiconductor laser 1 is connected with a power supply 8 so that current is supplied from the power supply 8 to the semiconductor laser 1. When current is supplied to the semiconductor laser 1 from the power supply 8, a semiconductor laser beam 3 is irradiated from the semiconductor laser 1 and absorbed by the solid state laser element 2, so that the active medium in the solid state laser element 2 is thereby excited.

A total reflection mirror 9 and a partial reflection mirror 10 are arranged on an optical axis with the solid state laser element 2 disposed therebetween. The total reflection mirror 9 has a high reflectance so that a laser beam 11 emitted from the solid state laser element 2 is substantially totally reflected by the mirror 9. The partial reflection mirror 10 has an appropriate reflectance for reflecting a part of the laser beam 11. Thus, these mirrors 9 and 10 cooperate with each other to constitute an optical resonator for taking out the laser beam 11 from the solid state laser element 2.

Next, a detailed description of the operation of the semiconductor laser excitation solid state laser apparatus according to the first embodiment will be made while using the prior art as a comparison example.

Figure 2:
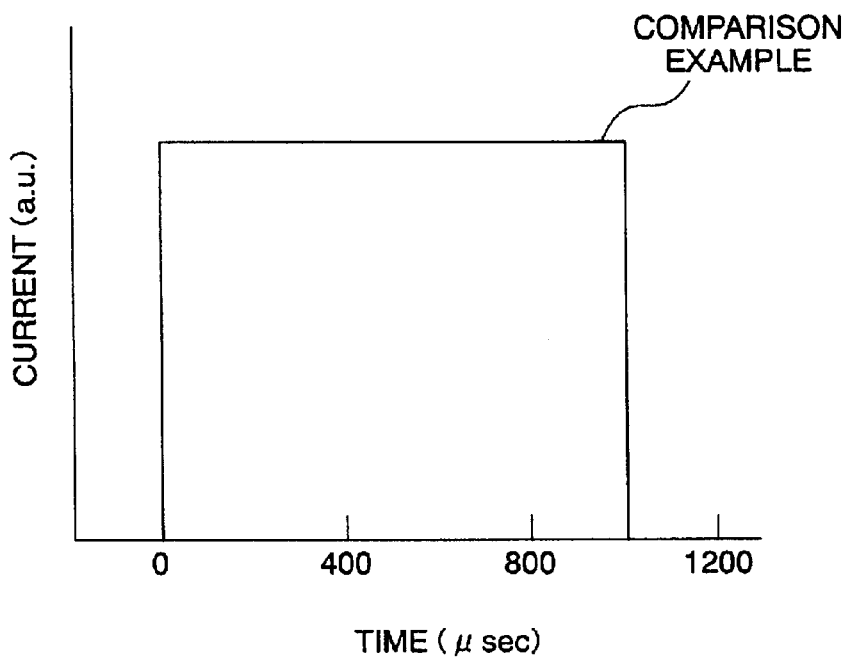
FIG. 2(a) is a view illustrating the waveform of current to be supplied to a semiconductor laser according to a comparison example in the first example.
FIG. 2(b) is a view illustrating the waveform of current to be supplied to a semiconductor laser according to the first embodiment.
Figure 2:
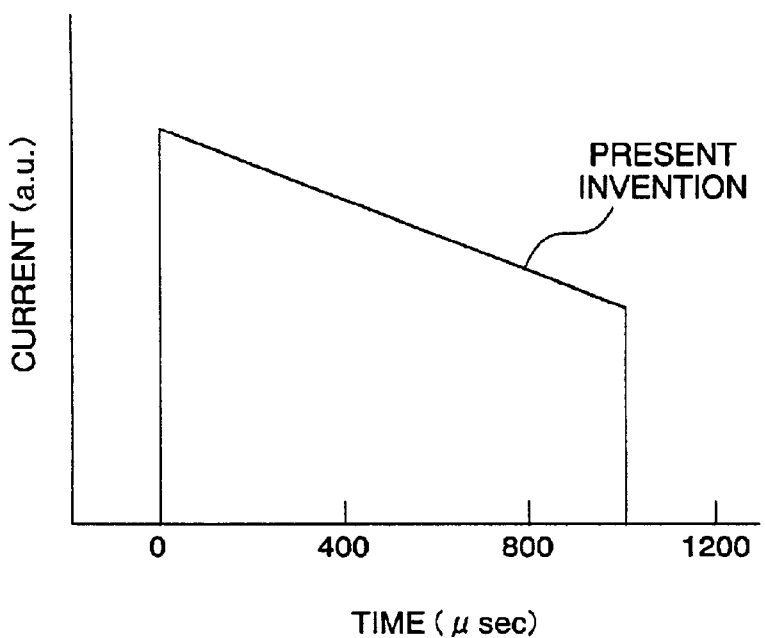

FIGS. 2(a) and 2(b) illustrate the waveforms of current supplied from the power supply 8 to the semiconductor laser 1 according to the comparison example and the first embodiment, respectively.

The value of current supplied to the semiconductor laser 1 over one pulse is constant in the comparison example (see FIG. 2(a)), but in the first embodiment, it is controlled such that the current value becomes the highest in an initial or early stage of the duration of the one pulse, and decreases successively with the lapse of time in the pulse duration (see FIG. 2(b)).

As described above, the oscillation spectrum of the semiconductor laser 1 depends on the temperature thereof.

Figure 3:
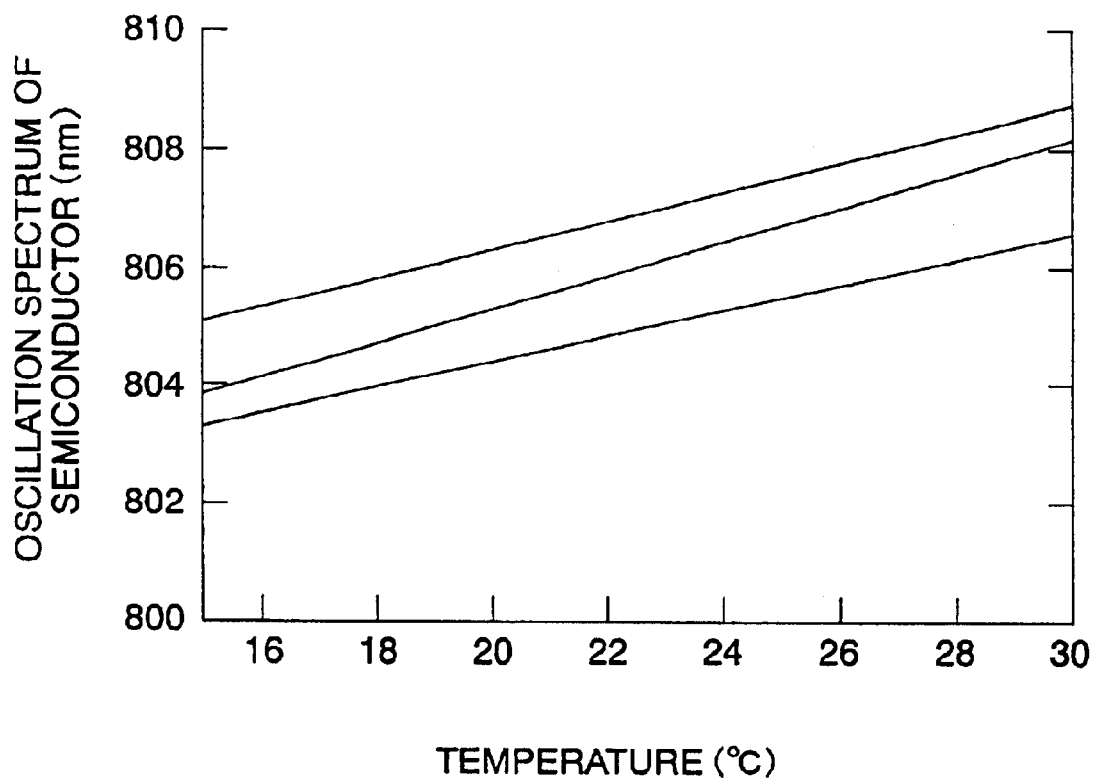
FIG. 3 is a view illustrating a relation between the oscillation spectrum and the temperature of the semiconductor laser.

FIG. 3 illustrates an example representative of the relation between the oscillation spectrum and the temperature of the semiconductor laser 1. As shown in FIG. 3, the higher the temperature of the semiconductor laser 1, the longer does the oscillation spectrum of the semiconductor laser 1 become.

As current is supplied to the semiconductor laser 1, the semiconductor laser 1 generates heat so that the internal temperature thereof starts rising. When the amount of heat generated by the semiconductor laser 1 and the amount of heat discharged by the temperature controller 7 reach a thermal equilibrium, the temperature of the semiconductor laser 1 becomes constant and the oscillation spectrum thereof becomes constant. However, the temperature controller 7 has a response time, and hence it takes time for the semiconductor laser 1 to reach a thermal equilibrium. Therefore, the oscillation spectrum changes at any time within the duration of one pulse until the thermal equilibrium is reached in the interior of the semiconductor laser 1.

Figure 4:
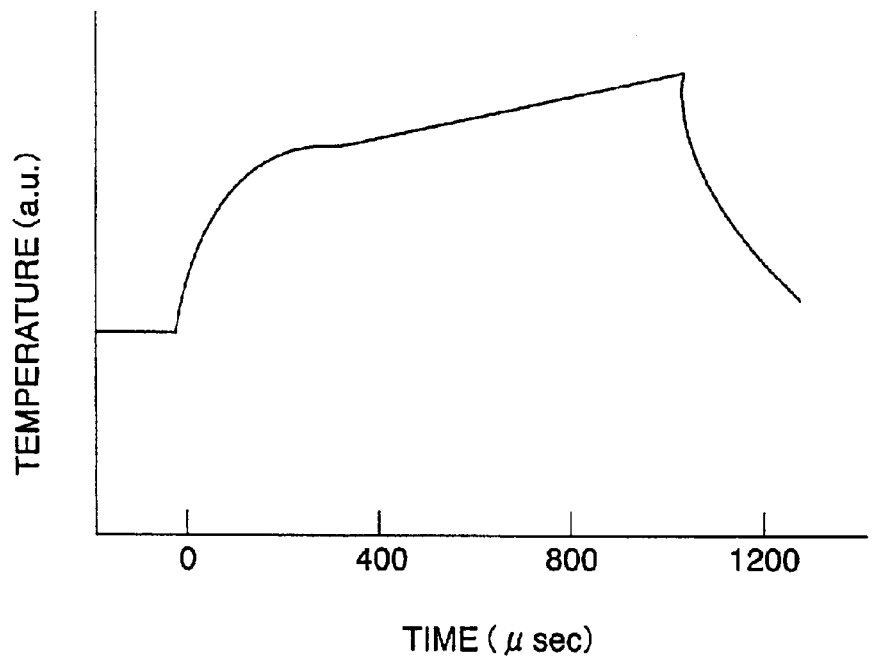
FIG. 4(a) is a view illustrating a temperature change in the semiconductor laser according to a comparison example in the first example.
FIG. 4(b) is a view illustrating a temperature change in the semiconductor laser according to the first embodiment.
Figure 4:
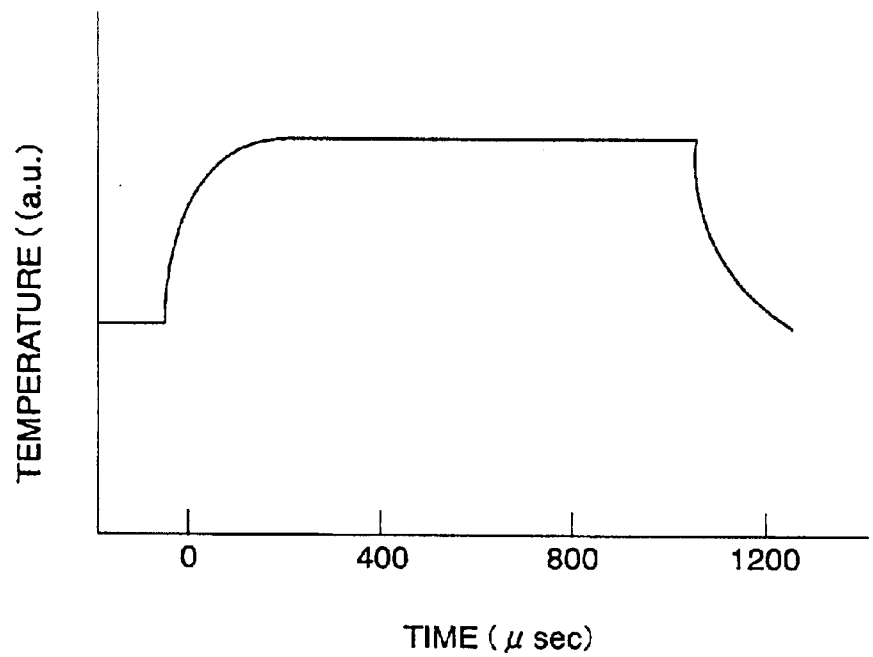

FIGS. 4(a) and 4(b) show the appearances of a temperature change in the semiconductor laser according to the comparison example and the first embodiment, respectively.

Since current rapidly rises up simultaneously with the start of a pulse, the amount of heat generated in the interior of the semiconductor laser 1 is greater than the amount of heat discharged therefrom, so that a difference in heat therebetween is accumulated therein to raise the temperature of the semiconductor laser 1. This temperature rise continues until the interior of the semiconductor laser 1 reaches a thermal equilibrium. However, in the case of the comparison example, a long time will be needed until a thermal equilibrium is reached since a constant amount of energy always continues to be input to the semiconductor laser 1 (see FIG. 4(a)).

On the other hand, according to the first embodiment of the invention, the amount of input energy decreases from the start of a pulse with the lapse of time so that a temperature rise due to overheating can be suppressed. Thus, the time required to reach a thermal equilibrium can be shortened (see FIG. 4(b)).

Figure 5:
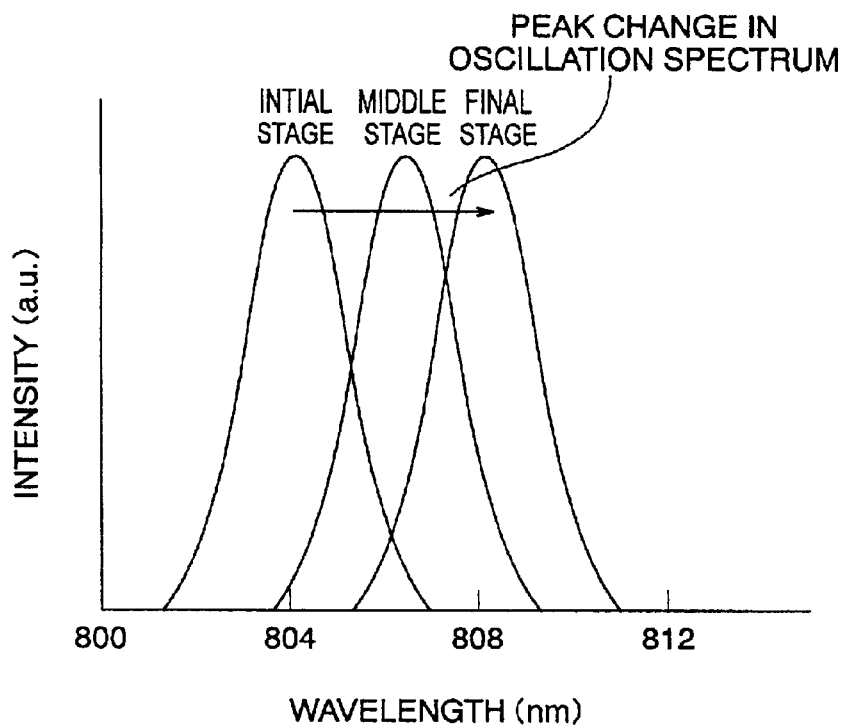
FIG. 5(a) is a view illustrating a change in the oscillation spectrum of the semiconductor laser according to a comparison example in the first example.
FIG. 5(b) is a view illustrating a change in the oscillation spectrum of the semiconductor laser according to the first embodiment.
Figure 5:
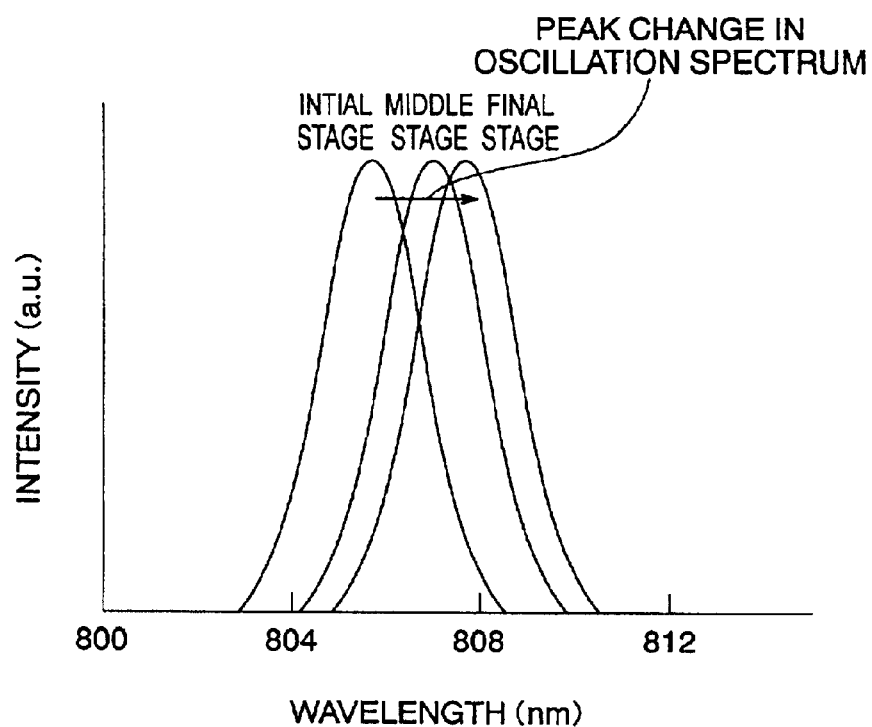

The oscillation spectrum of the semiconductor laser 1 changes in accordance with this temperature change, so the oscillation spectrum of the semiconductor laser 1 always keeps changing within one pulse if a thermal equilibrium is not reached within the duration of one pulse operation. When a change in the oscillation spectrum of the semiconductor laser 1 with respect to the pulse operation shown in FIGS. 2(a) and 2(b) is illustrated in three periods including an initial or early stage (0–100 μsec from the start of pulse rising), a middle stage (400–500 μsec) and a final or later stage (900–1000 μsec), such a change is expressed in FIG. 5(a) for the comparison example, and in FIG. 5(b) for the first embodiment of the present invention. Here, for one example, there is shown the case in which the oscillation spectrum of the semiconductor laser 1 is substantially coincides with the absorption spectrum of the solid state laser element 2 at the state of a thermal equilibrium.

Figure 6:
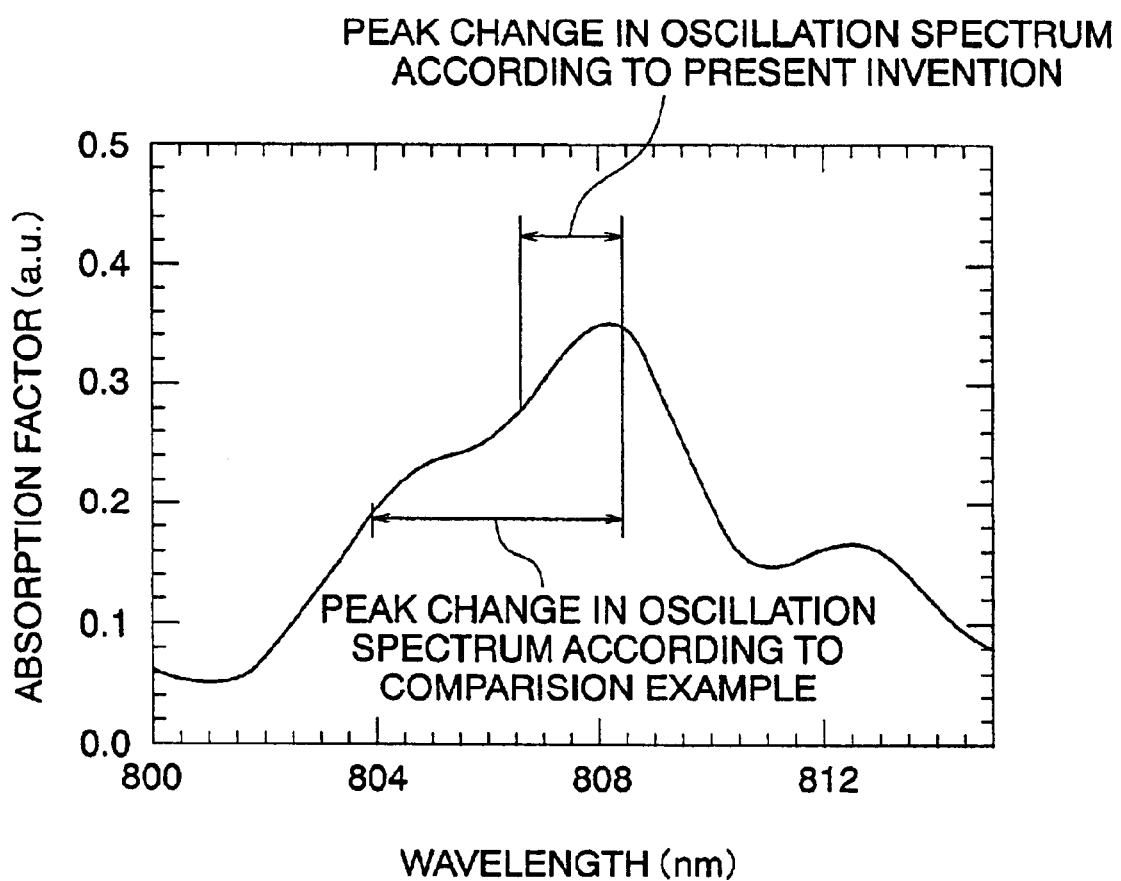
FIG. 6 is a view illustrating the absorption spectrum of a solid state laser element.

FIG. 6 illustrates the absorption spectrum of the solid state laser element 2 in the form of an Nd:YAG, and as shown in this figure, a spectrum absorption factor of the Nd:YAG laser element has a peak at a wavelength in the vicinity of 808 nm, and rapidly decreases before and after this peak wavelength. The comparison example exhibits that the oscillation spectrum changes greatly within one pulse of the semiconductor laser beam which is an excitation light, and that there is inconsistency between the oscillation spectrum of the semiconductor laser 1 and the absorption spectrum of the solid state laser element 2 over the entire duration of the pulse.

Figure 7:
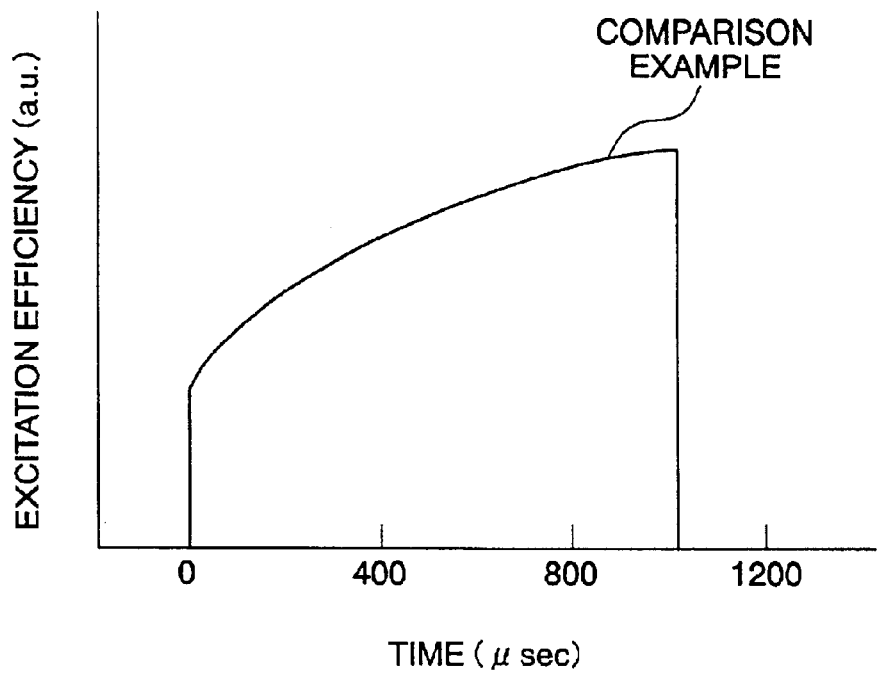
FIG. 7(a) is a view illustrating a change in the excitation efficiency of the semiconductor laser according to a comparison example in the first example.
FIG. 7(b) is a view illustrating a change in the excitation efficiency of the semiconductor laser according to the first embodiment.
Figure 7:
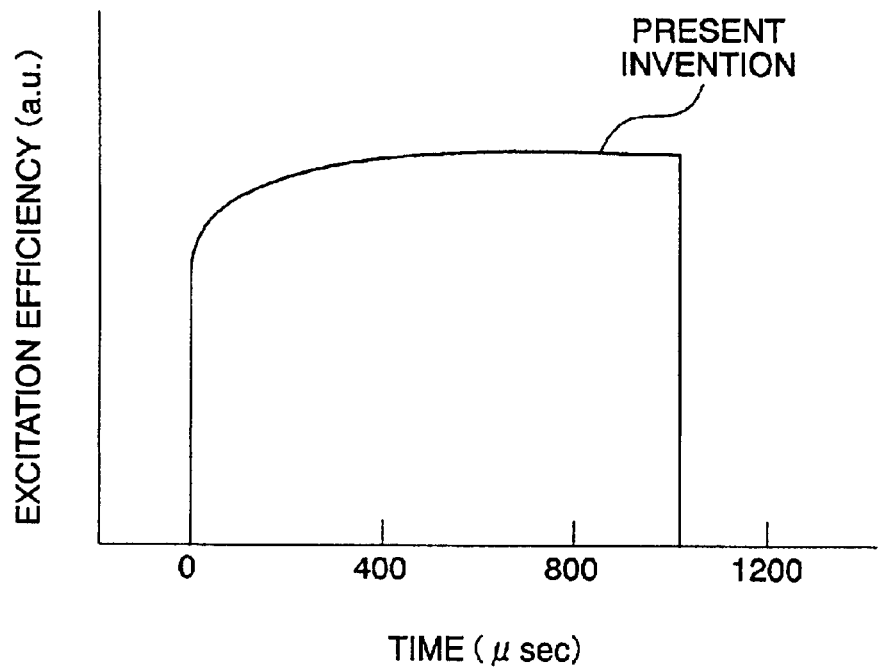

FIGS. 7(a) and 7(b) illustrate the excitation efficiency of the comparison example and that of the first embodiment of the present invention, respectively.

In the comparison example, a change in the oscillation spectrum causes the excitation efficiency to decrease greatly in the initial stage of one pulse (see FIG. 7(a)). On the other hand, in the first embodiment, the excitation efficiency is high over the entire duration of one pulse and can be maintained almost constant (see FIG. 7(b)).

Figure 8:
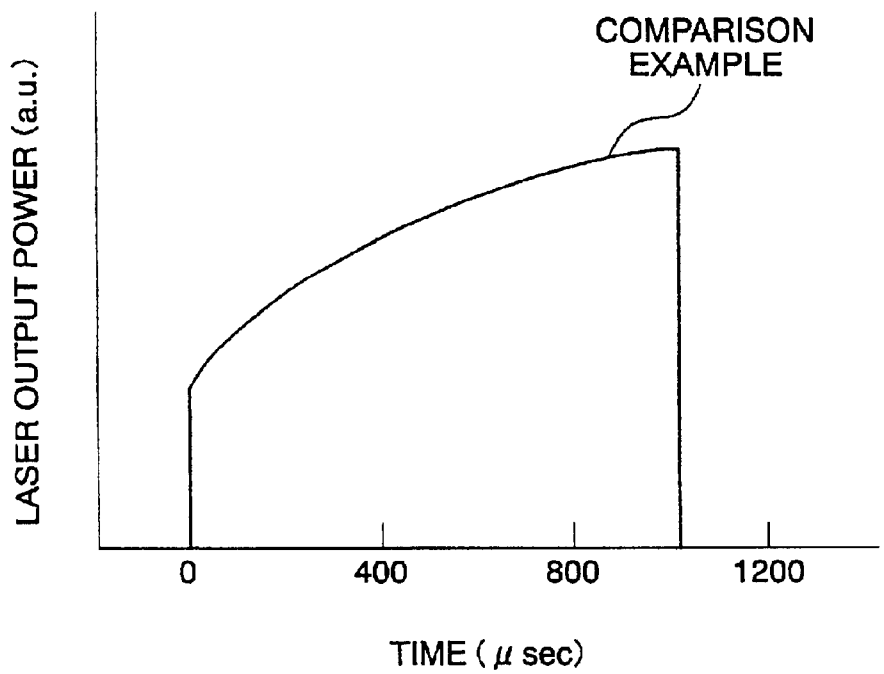
FIG. 8(a) is a view illustrating the laser output power waveform in a comparison example in the first example.
FIG. 8(b) is a view illustrating the laser output power waveform in the first embodiment.
Figure 8:
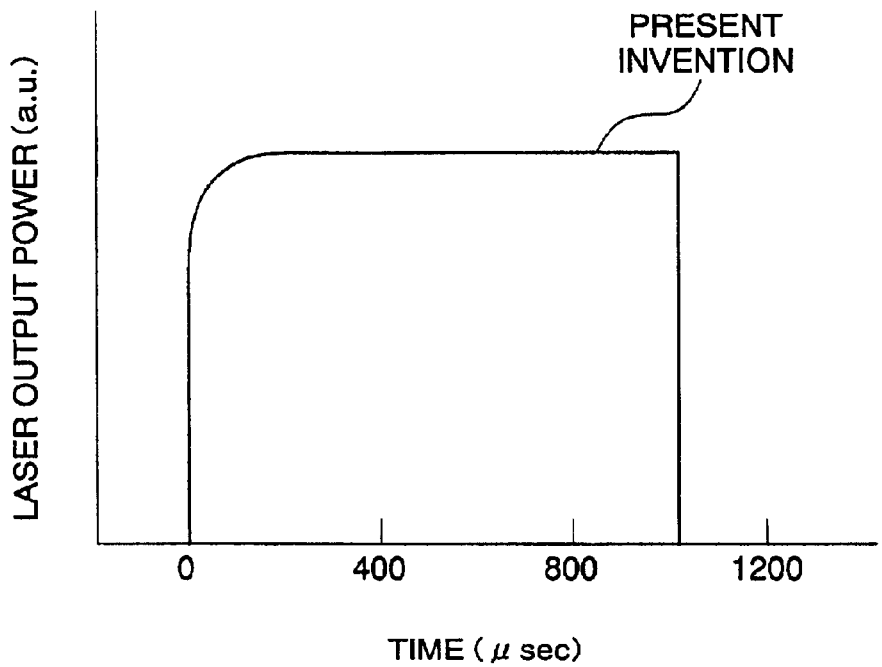

The waveform of laser output power of the comparison example obtained finally is shown in FIG. 8(a) and that of the first embodiment is shown in FIG. 8(b). The comparison example has a big collapse in the output waveform, whereas the first embodiment provides a constant, high output over the entire pulse. This is mainly a reflection of the excitation efficiencies. In addition, in the first embodiment, since a large current is supplied to the semiconductor laser 1 in the initial stage of the pulse, the output of the semiconductor laser 1 becomes high, so that a reduction in the excitation efficiency can be compensated, thus achieving the effect of further stabilizing the laser output power. Moreover, successive reduction of the current also provides another effect of reducing power consumption.

When these lasers are applied to processing or machining, in t he comparison example, processing or machining performance is deteriorated, and laser output power per pulse is low, thus resulting in a reduced processing or machining efficiency. On the other hand, in the first embodiment, the waveform of laser output power maintains substantially a rectangular shape, and high output power is obtained for the entire pulse. As a result, processing or machining can be carried out with excellent performance and efficiency.

Even in the case of using the semiconductor laser 1 which has an oscillation spectrum at the time of a thermal equilibrium shorter in wavelength than the absorption spectrum of the solid state laser element 2, it is possible to always achieve an operation nearly as in the state at a thermal equilibrium. Therefore, the first embodiment can avoid a remarkable reduction in the excitation efficiency in the initial stage of a pulse, thus maintaining a high excitation efficiency and achieving a further enhanced effect.

As described above, according to the first embodiment of the present invention, the current supplied from the power supply 8 to the semiconductor laser 1 is controlled to be changed (i.e., decreased successively) within one pulse, so that the solid state laser element 2 can be excited efficiently while reducing power consumption. As a consequence, it is possible to obtain a high power laser beam in a stable manner. In addition, the first embodiment can achieve the above operation by means of current control alone, and hence has an advantage that a laser apparatus with high performance can be obtained easily at low cost.

Embodiment 2

Figure 9:
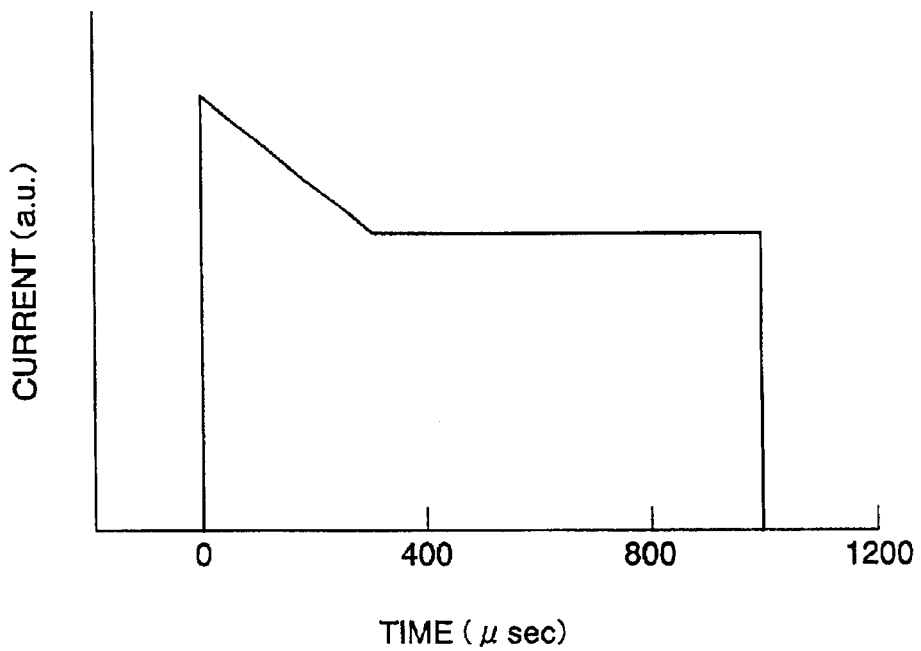
FIG. 9 is a view illustrating the waveform of current to be supplied to a semiconductor laser according to a second embodiment of the present invention.

Although in the above-mentioned first embodiment, such a construction has been shown and described that the current supplied from the power supply 8 to the semiconductor laser 1 is decreased successively over the entire duration of one pulse, the method of decreasing the current is not limited to this. For instance, it can be constructed such that the current supplied to the semiconductor laser 1 is decreased only in the initial stage of a pulse, as illustrated in FIG. 9. Such a construction serves to suppress reduction in the excitation efficiency in the initial stage of the pulse, thereby making it possible to always perform excitation in an efficient manner. Thus, a stable laser beam is obtained.

Embodiment 3

Figure 10:
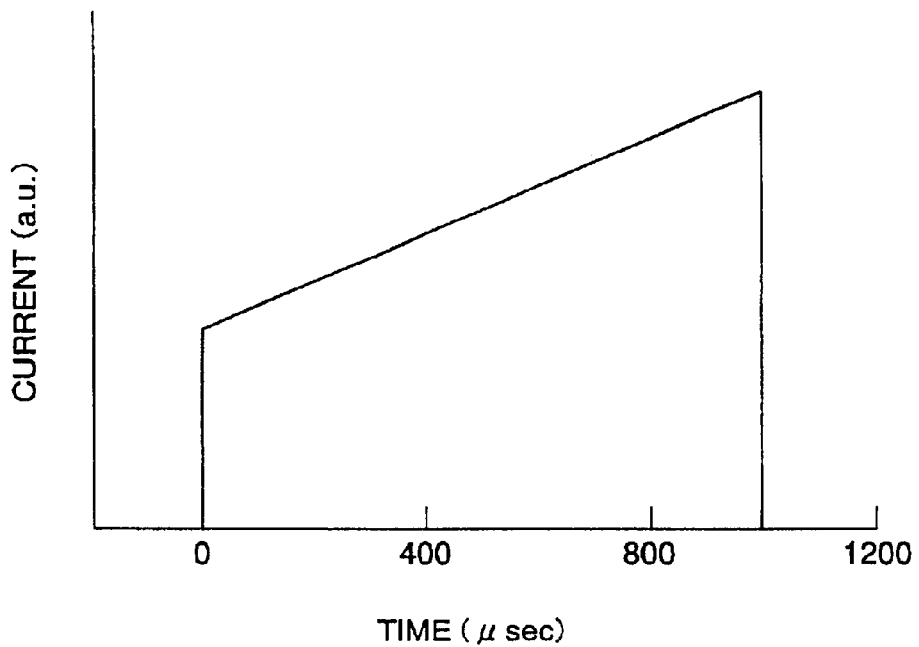
FIG. 10 is a view illustrating the waveform of current to be supplied to a semiconductor laser according to a third embodiment of the present invention.

FIG. 10 illustrates a current waveform for driving a semiconductor laser of a semiconductor laser excitation solid state laser apparatus according to a third embodiment of the present invention.

The third embodiment is characterized in that the current to be supplied to the semiconductor laser 1 is successively increased within one pulse.

Figure 11:
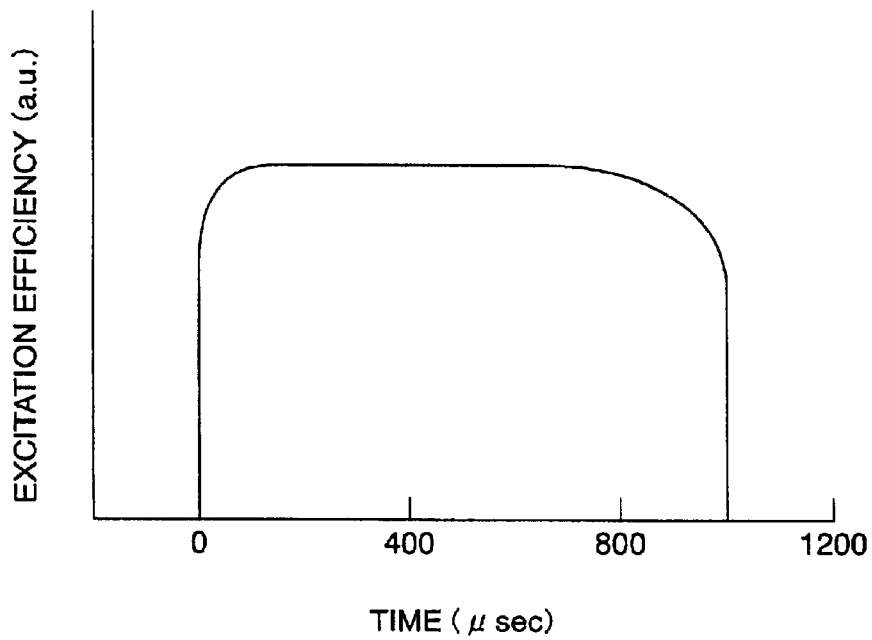
FIG. 11(a) is a view illustrating the excitation efficiency of the semiconductor laser according to the third embodiment.
FIG. 11(b) is a view illustrating the waveform of laser output power according to the third embodiment.
Figure 11:
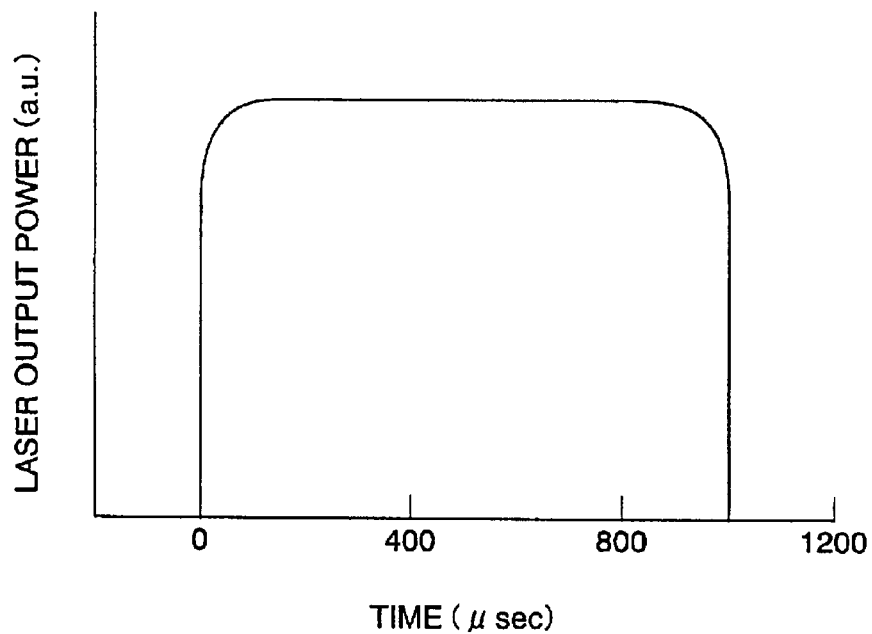

As shown in FIG. 10, by increasing the current to be supplied to the semiconductor laser 1 within one pulse, substantially a constant oscillation efficiency can be maintained over the entire duration of one pulse in the case where the oscillation spectrum of the semiconductor laser 1 is longer than the absorption spectrum of the solid state laser element 2, This is explained as follows. First of all, in the initial stage of a pulse, the current value is small so that the oscillation wavelength of the semiconductor laser 1 at this time is shorter and the excitation efficiency higher than in the state of a thermal equilibrium. A change in the excitation efficiency in accordance with the changing oscillation spectrum is illustrated in FIG. 11(*a*). In the later or the final stage of a pulse, though the oscillation spectrum becomes longer and hence a low excitation efficiency results, the current value is large so the output power of the semiconductor laser becomes great. In this embodiment, however, this is compensated for and an almost constant output is obtained over the entire pulse as illustrated in FIG. 11(*b*).

Figure 12:
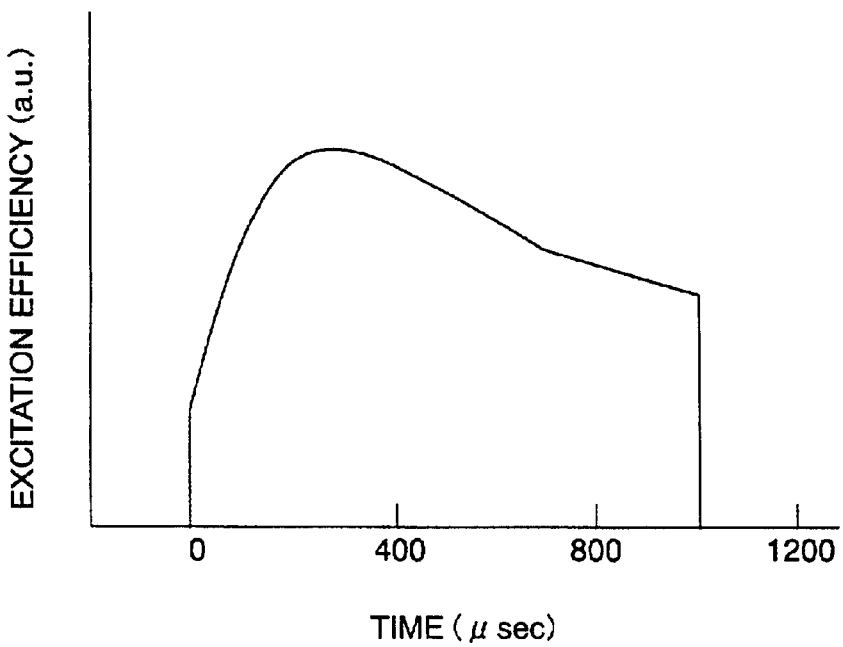
FIG. 12(a) is a view illustrating the excitation efficiency of a semiconductor laser according to a comparison example in the third embodiment.
FIG. 12(b) is a view illustrating the waveform of laser output power according to the comparison example in the third embodiment.
Figure 12:
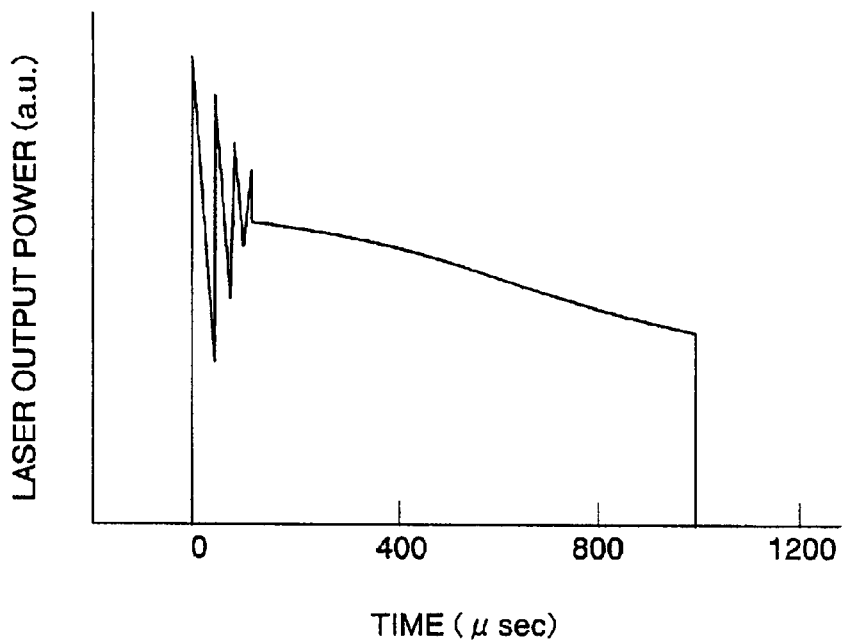

Moreover, when the oscillation spectrum of the semiconductor laser 1 is longer than the absorption spectrum of the solid state laser element 2 as described above, the excitation light absorption factor immediately after the start of laser oscillation becomes high in the comparison example shown in FIG. 12(*a*). In this case, relaxed oscillation (i.e., gradual oscillation) is generated immediately after the start of laser oscillation, as shown in FIG. 12(*b*). However, according to the third embodiment, since the absorption factor can be decreased by reducing the current value in the initial stage of the pulse, the relaxed oscillation can be suppressed. In addition, by lowering the current value in the initial stage of the pulse, power consumption is reduced, thus providing an effect to improve the efficiency of the laser.

As described above, according to the third embodiment, by successively increasing the current to be supplied to the semiconductor laser 1 when pulse excitation is performed by the use of the semiconductor laser 1, a constant oscillation efficiency can be maintained at all times while decreasing power consumption. Besides, relaxed oscillation can be effectively suppressed. As a result, even with the use of a semiconductor laser having a long oscillation spectrum, the laser output power of one pulse can be held constant and a high degree of processing quality can be obtained.

Embodiment 4

Figure 13:
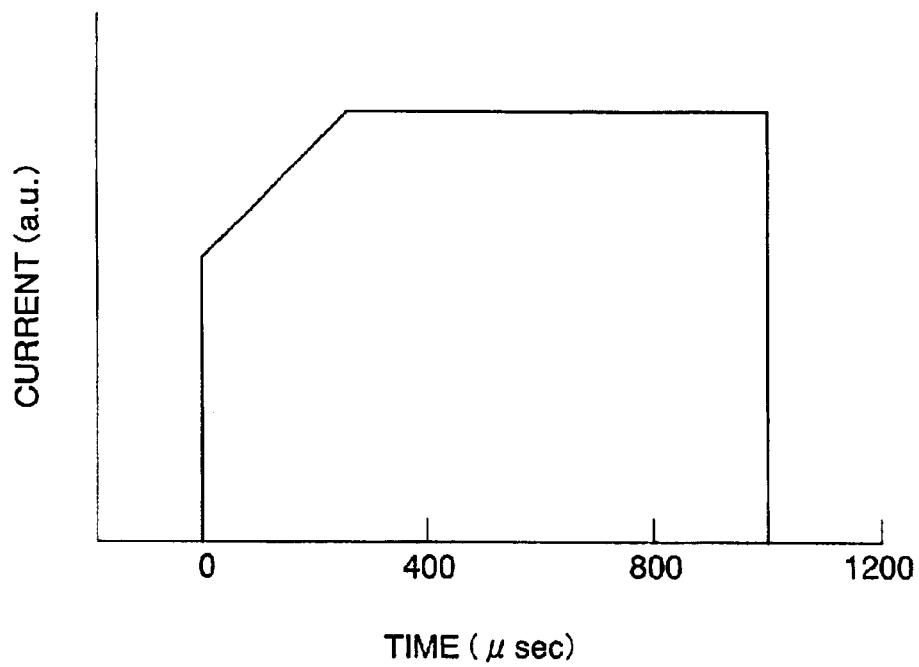
FIG. 13 is a view illustrating the waveform of current to be supplied to a semiconductor laser according to a fourth embodiment of the present invention.

Although in the above-mentioned third embodiment, it is constructed that the current to be supplied to the semiconductor laser 1 over the entire pulse is increased successively, the method of increasing the current is not limited to this. For instance, as illustrated in FIG. 13, by successively increasing the current only in the initial stage of one pulse, the generation of relaxed oscillation can be suppressed effectively irrespective of the oscillation spectrum, and a high degree of processing quality can be obtained. In addition, damage to optical components can be prevented. damaged.

Embodiment 5

Figure 14:
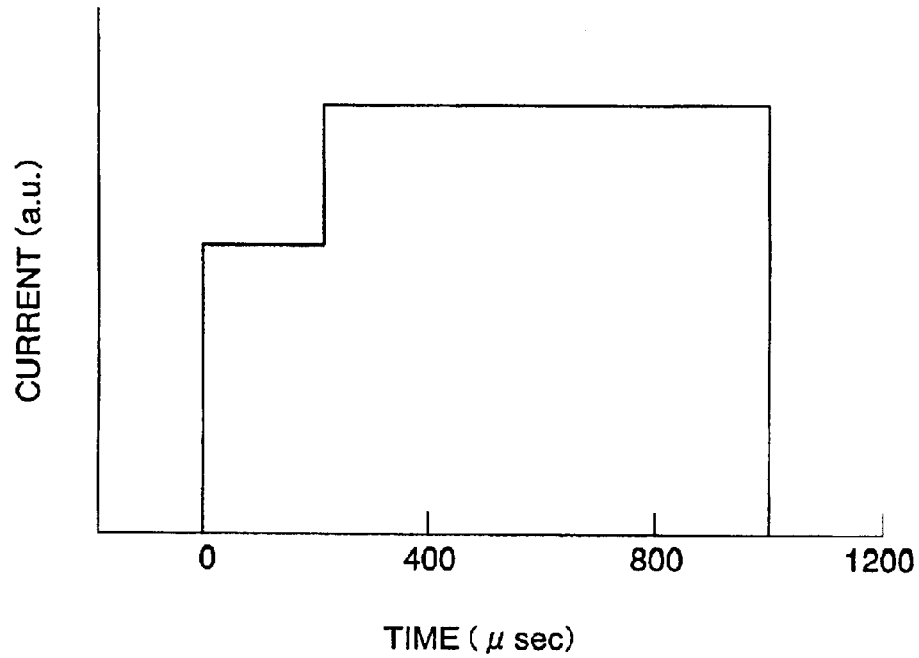
FIG. 14 is a view illustrating the waveform of current to be supplied into a semiconductor laser according to a fifth embodiment of the present invention.

Although in the first through fourth embodiments, the construction of continuously increasing current has been shown and described, current may be changed in a stepwise manner. For instance, even in the case where the current value is decreased stepwise only in the head or leading portion of a pulse, as illustrated in FIG. 14, the same effects as in the fourth embodiment can be obtained, and it becomes easy to control the current.

Here, note that in this fifth embodiment 5, the current to be supplied to the semiconductor laser 1 is changed stepwise in one step, but it may be changed in a plurality of steps.

Embodiment 6

Figure 15:
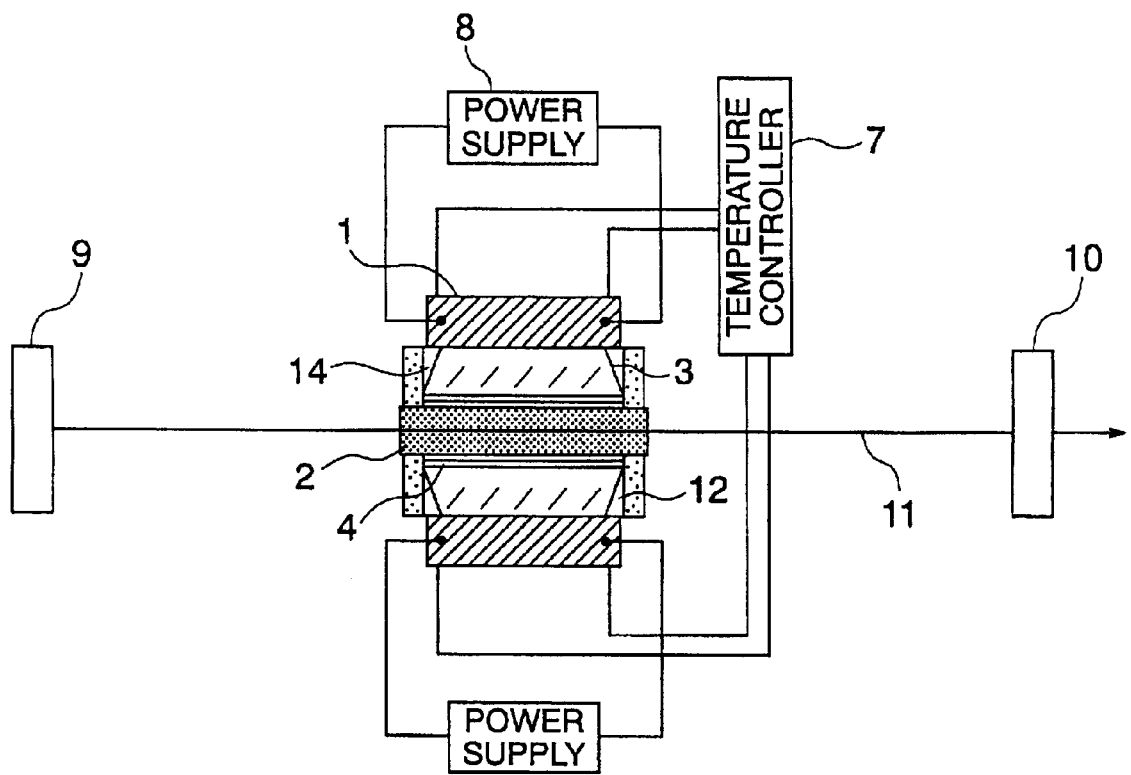
FIG. 15 is a block diagram illustrating a semiconductor laser excitation solid state laser apparatus according to a sixth embodiment of the present invention.

FIG. 15 illustrates a semiconductor laser excitation solid state laser apparatus according to a sixth embodiment of the present invention.

In FIG. 15, the same parts as those in the first embodiment are identified by the same symbols, while omitting a description thereof.

In the following, the components newly added in this embodiment will be described. A diffusive reflector 12 is arranged so as to enclose a solid state laser element 2, and has its inner surface configured to diffuse and reflect a semiconductor laser beam 3. The diffusive reflector 12 is provided with an opening (not shown) for guiding into the interior thereof the semiconductor laser beam 3 emitted from a semiconductor laser 1. Also, mounted on the diffusive reflector 12 at its opening is an optical waveguide element 14 for guiding the semiconductor laser beam 3. The optical waveguide element 14 is formed of sapphire, or undoped YAG (Yttrium Aluminum Garnet), or glass having a high refractive index with respect to the semiconductor laser beam 3, etc.

The semiconductor laser beam 3 having entered the interior of the optical waveguide element 14 is effectively guided therein by virtue of repeated total reflections in the interior of the optical waveguide element 14 owing to a difference in the refractive index between the optical waveguide element 14 and its surroundings. In addition, an antireflection coating nonreflective against the semiconductor laser beam 3 is given to an end face of the optical waveguide element 14, and the semiconductor laser 1 is arranged adjacent to the end face of the optical waveguide element 14, so that the semiconductor laser beam 3 is guided into the interior of the diffusive reflector 12 with almost no or little loss. Here, note that in the case of the semiconductor laser excitation solid state laser apparatus according to this sixth embodiment, current is supplied to the semiconductor laser 1 in the same manner as previously described with reference to the above-mentioned first through fifth embodiments.

Thus, according to the sixth embodiment 6, part of the excitation light not absorbed by the solid state laser element 2 passes through the solid state laser element 2, and is then diffused and reflected by the inner surface of the diffusive reflector 12, thereby exciting the solid state laser element 2 again. As a result, the solid state laser element 2 can be excited uniformly and efficiently, making it possible for a laser beam to be taken out with a further increased efficiency.

Further, since the optical waveguide element 14 is installed on the diffusive reflector 12, the excitation light can be efficiently guided into the interior of the diffusive reflector 12 by means of the optical waveguide element 14. This serves to provide a more efficient semiconductor laser excitation solid state laser apparatus.

It is to be noted that though the sixth embodiment has been shown and described in the case where a diffusive reflector is used with its inner surface being composed of a diffuse reflection surface, the reflector may instead have an inner surface highly reflective against the semiconductor laser beam 3, such as, for example, a gold inner surface subjected to mirror polishing. a glass inner surface covered with a total reflection coating totally reflective against the semiconductor laser beam 3, etc.

Additionally, although in the sixth embodiment, the optical waveguide element 14 has been shown as a plate-shaped member, it may instead be of any shape such as a wedge shape, the one having a lens effect, etc. Further, the construction using the optical waveguide element 14 has been shown herein, but without using this, the semiconductor laser 1 may be arranged adjacent to the unillustrated opening in the reflector 12. Besides, the entire portion or a part of the inner surface at the opening of the reflector may be formed of a coating or an optical element highly reflective against semiconductor laser beam so that the semiconductor laser beam can be efficiently transmitted to the interior of the reflector.

Embodiment 7

Figure 16:
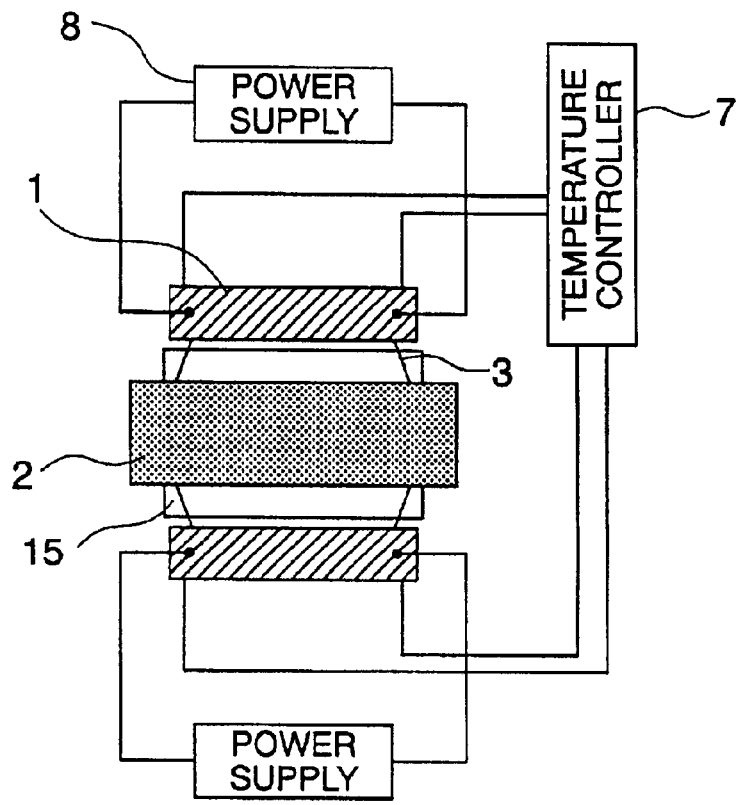
FIG. 16(a) is a block diagram illustrating a semiconductor laser excitation solid state laser apparatus according to a seventh embodiment of the present invention.
FIG. 16(b) is a block diagram schematically illustrating essential portions of the semiconductor laser excitation solid state laser apparatus according to the seventh embodiment.
Figure 16:
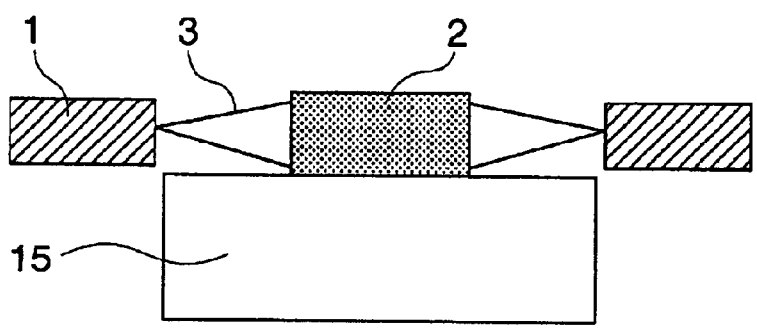

Although in any of the above-mentioned embodiments, the solid state laser element 2 has been described as having a rod-shaped configuration, the cross sectional shape of the solid state laser element 2 is not limited to a circular shape, but it may be any shape such as, for example, a rectangle, an oval, etc. Moreover, it has been described that the solid state laser element 2 is cooled by the cooling medium 5 which is caused to flow in the flow tube 4 arranged to enclose the surroundings of the element 2, but the means or method for cooling is not limited to this, and any cooling means or method may be used. For instance, if a solid state laser element 2 having a rectangular cross section is arranged on a cooling plate 15 as illustrated in FIGS. 16(a) and 16(b), it is possible to cool the solid state laser element 2 by the use of a simple construction.

It is to be noted that in any of the above-mentioned embodiments, the solid state laser element 2 has been described as using an Nd:YAG, but the present invention is not limited to this, and any solid state laser element may be used which is capable of being optically excited by a semiconductor laser.

As described in the foregoing, according to the present invention, there is provided a semiconductor laser excitation solid state laser apparatus including a solid state laser element containing an active medium, a semiconductor laser for optically exciting the solid state laser element, a power supply for supplying electric power to the semiconductor laser, and an optical resonator for taking out a laser beam from the optically excited solid state laser element. When the semiconductor laser is pulse-operated to pulse-excite the solid state laser element, the current supplied to the solid state laser element is changed within one pulse. With this arrangement, the oscillation spectrum and the output power of the semiconductor laser can be controlled within one pulse, thus achieving a stable and efficient semiconductor laser excitation solid state laser apparatus.

Moreover, since the current to be supplied to the semiconductor laser is controlled to decrease successively within one pulse, the solid state laser element can be excited efficiently while reducing power consumption. Additionally, a change in the oscillation spectrum of the semiconductor laser can be reduced to always maintain the oscillation efficiency of the laser at a constant level, as a consequence of which a semiconductor laser excitation solid state laser apparatus can be obtained which operates in a stable and efficient manner.

Further, in a preferred form of the present invention, by successively decreasing the current to be supplied to the semiconductor laser only in an initial or early stage of the pulse, a reduction in the excitation efficiency in the initial or early stage of the pulse is suppressed, whereby the solid state laser element can be excited efficiently at any time to generate a stable laser beam.

Furthermore, in another preferred form of the present invention, the current to be supplied to the semiconductor laser is increased successively within one pulse, so that a constant oscillation efficiency can always be maintained while reducing power consumption. In addition, relaxed oscillation, which would be generated immediately after the start of laser oscillation, can be suppressed, so that a semiconductor laser excitation solid state laser apparatus can be obtained which is stable and efficient in operation.

Still further, in a further preferred form of the present invention, since the current to be supplied to the semiconductor laser is changed to increase successively only in an initial or early stage of the pulse within one pulse, the generation of relaxed oscillation is suppressed irrespective of the oscillation spectrum. Consequently, it is possible not only to provide a high-quality laser beam but also prevent damage to optical components.

In addition, in a yet further preferred form of the present invention, since the current to be supplied to the semiconductor laser is changed to decrease stepwise within one pulse, it is possible to provide, in addition to the above-mentioned effects, a semiconductor laser excitation solid state laser apparatus which is easy to perform current control and inexpensive to manufacture.

Moreover, in a still further preferred form of the present invention, by the provision of a diffusive reflector and an optical waveguide element, it is possible to efficiently guide excitation light into the interior of the diffusive reflector. As a result, the solid state laser element can be excited uniformly and efficiently, so that the laser beam can be taken out with a further enhanced efficiency.

Further, in a further preferred form of the present invention, by arranging a solid state laser element of a rectangular cross section on a cooling plate, it is possible to cool the solid state laser element by using a simple construction.

What is claimed is:

1. A solid state laser apparatus comprising:
    a solid state laser element containing an active medium and generating laser light in response to incident excitation light;
    a semiconductor laser producing the excitation light for optically exciting said solid state laser element to produce the laser light;
    a power supply producing pulses of current, each pulse changing in magnitude during the pulse, the pulses being supplied to said semiconductor laser and causing said semiconductor laser to output pulses of the excitation light; and
    an optical resonator for producing a laser beam from the laser light emitted from said solid state laser element, in response to the excitation light produced by said semiconductor laser.

2. The solid state laser apparatus according to claim 1, wherein the pulses of current produced by said power supply and supplied to said semiconductor laser to excite said solid state laser element decrease in magnitude with time during each pulse.

3. The solid state laser apparatus according to claim 1, wherein the pulses of current produced by said power supply and supplied to said semiconductor laser to excite said solid state laser element that decrease in magnitude during an initial stage of each pulse and are uniform in magnitude after the initial state of each pulse.

4. The solid state laser apparatus according to claim 1, wherein the pulses of current produced by said power supply and supplied to said semiconductor laser to excite said solid state laser element increase in magnitude with time during each pulse.

5. The solid state laser apparatus according to claim 1, wherein the pulses of current produced by said power supply and supplied to said semiconductor laser to excite said solid state laser element increase in magnitude during an initial stage of each pulse and are uniform in magnitude after the initial state of each pulse.

6. The solid state laser apparatus according to claim 1, wherein the pulses of current produced by said power supply and supplied to said semiconductor laser to excite said solid state laser element change stepwise in magnitude with time during each pulse.

7. The solid state laser apparatus according to claim 1, further comprising:
    a diffusive reflector enclosing said solid state laser element and having an inner surface diffusing and reflecting the excitation light; and
    an optical waveguide element for guiding the excitation light emitted by said semiconductor laser into said diffusive reflector while repeatedly totally reflecting the excitation light.

8. The solid state laser apparatus according to claim 1 including a cooling plate, wherein said solid state laser element has a rectangular cross section and is located on said cooling plate.

9. The solid state laser apparatus according to claim 6, wherein the pulses of current produced by said power supply and supplied to said semiconductor laser to excite said solid state laser element that change stepwise in magnitude, increase in magnitude after an initial stage of each pulse.

10. A solid state laser apparatus comprising:
    a solid state laser element containing an active medium and generating laser light in response to incident excitation light;
    a semiconductor laser producing the excitation light for optically exciting said solid state laser element to produce the laser light; and
    a power supply producing pulses of current, each pulse changing in magnitude during the pulse, the pulses being supplied to said semiconductor laser and causing said semiconductor laser to output pulses of the excitation light.

11. The solid state laser apparatus according to claim 10, wherein the pulses of current produced by said power supply and supplied to said semiconductor laser to excite said solid state laser element decrease in magnitude with time during each pulse.

12. The solid state laser apparatus according to claim 10, wherein the pulses of current produced by said power supply and supplied to said semiconductor laser to excite said solid state laser element that decrease in magnitude during an initial stage of each pulse and are uniform in magnitude after the initial state of each pulse.

* * * * *